United States Patent
Berard et al.

(10) Patent No.: US 9,502,269 B2
(45) Date of Patent: Nov. 22, 2016

(54) METHOD AND APPARATUS FOR COOLING ELECTONIC COMPONENTS

(71) Applicant: BAE SYSTEMS INFORMATION AND ELECTRONIC SYSTEMS INTEGRATION INC., Nashua, NH (US)

(72) Inventors: Alan M. Berard, Manassas, VA (US); John A. Hughes, Falls Church, VA (US); Keith K. Sturcken, Nokesville, VA (US); Timothy Whalen, Manassas, VA (US)

(73) Assignee: BAE Systems Information and Electronic Systems Integration Inc., Nashau, NH (US)

( * ) Notice: Subject to any disclaimer, the term of this patent is extended or adjusted under 35 U.S.C. 154(b) by 55 days.

(21) Appl. No.: 14/676,503

(22) Filed: Apr. 1, 2015

(65) Prior Publication Data

US 2015/0289414 A1 Oct. 8, 2015

Related U.S. Application Data

(60) Provisional application No. 61/974,711, filed on Apr. 3, 2014.

(51) Int. Cl.
| | | |
|---|---|---|
| *H01L 21/50* | (2006.01) | |
| *H01L 23/36* | (2006.01) | |
| *H01L 23/10* | (2006.01) | |
| *H01L 23/427* | (2006.01) | |

(52) U.S. Cl.
CPC ............... *H01L 21/50* (2013.01); *H01L 23/36* (2013.01); *H01L 23/10* (2013.01); *H01L 23/427* (2013.01); *H01L 2924/0002* (2013.01); *Y10T 29/49353* (2015.01)

(58) Field of Classification Search
CPC .................. H01L 21/50; H01L 23/36; H01L 2924/0002; H01L 23/10; H01L 23/427; H01L 2924/00; Y10T 29/49353
See application file for complete search history.

(56) References Cited

U.S. PATENT DOCUMENTS

| | | | | |
|---|---|---|---|---|
| 3,936,864 A * | 2/1976 | Benjamin | ............... | H01L 23/66 174/551 |
| 4,025,716 A * | 5/1977 | Morse | ...................... | H01L 21/50 174/540 |
| 4,764,804 A * | 8/1988 | Sahara | .................... | H01L 23/24 174/16.3 |
| 5,455,457 A * | 10/1995 | Kurokawa | .......... | H01L 23/3737 257/704 |
| 5,744,863 A * | 4/1998 | Culnane | ................ | H01L 21/563 257/704 |
| 5,805,430 A * | 9/1998 | Atwood | .............. | H01L 23/4006 257/E23.084 |
| 6,617,683 B2 * | 9/2003 | Lebonheur | ............ | H01L 23/433 257/707 |
| 8,564,114 B1 * | 10/2013 | Lanzone | ............. | H01L 23/3128 257/276 |
| 2003/0194605 A1 * | 10/2003 | Fauteux | .................. | H01M 2/26 429/149 |
| 2005/0099774 A1 * | 5/2005 | Song | .................... | H01L 23/3672 361/700 |
| 2010/0013084 A1 * | 1/2010 | Medeiros, III | ........ | H01L 23/055 257/693 |
| 2010/0301496 A1 * | 12/2010 | Koduri | .................. | H01L 23/492 257/777 |
| 2011/0193097 A1 * | 8/2011 | Autry | ..................... | H01L 21/50 257/77 |

* cited by examiner

*Primary Examiner* — Adam B Dravininkas
(74) *Attorney, Agent, or Firm* — Antony P. Ng; Russell Ng PLLC; Daniel J. Long

(57) ABSTRACT

An apparatus for cooling electronic devices to be used in the vacuum of space is described. a window frame is provided as packaging for an electronic device having a substrate and a chip. The window frame includes an opening to allow a heat pipe to be in direct contact with a backside of the chip. The window frame is hermetically sealed to the backside of the chip. The window frame is also welded to a kovar ring located on the backside of the chip to provide a hermetic seal between the window frame and the substrate.

16 Claims, 3 Drawing Sheets

METHOD AND APPARATUS FOR COOLING ELECTONIC COMPONENTS

PRIORITY CLAIM

The present application claims priority under 35 U.S.C. §119(e)(1) to provisional application No. 61/974,711, filed on Apr. 3, 2014, the contents of which are incorporated herein by reference.

BACKGROUND OF THE INVENTION

1. Technical Field

The present invention relates to space electronics in general, and in particular to a method and apparatus for cooling electronic devices to be used in the vacuum of space.

2. Description of Related Art

Electronic devices that are used in space cannot be cooled by air because they generally operate in vacuum. However, the operating temperatures of application specific integrated circuits (ASICs) are generally too high to be used in space without using any expensive cooling techniques that may not be qualified for space applications.

Consequently, it would be desirable to provide a method and apparatus for cooling electronic components in the vacuum of space.

SUMMARY OF THE INVENTION

In accordance with a preferred embodiment of the present invention, a window frame is provided as packaging for an electronic device having a substrate and a chip. The window frame includes an opening to allow a heat pipe to be in direct contact with a backside of the chip. The window frame is hermetically sealed to the backside of the chip. The window frame is also welded to a kovar ring located on the backside of the chip to provide a hermetic seal between the window frame and the substrate.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1:
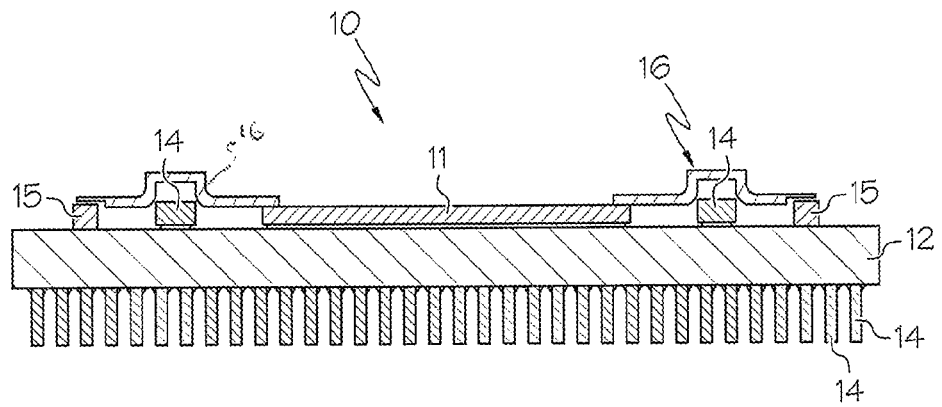
FIG. 1 is a cross-sectional diagram of an electronic device in which a preferred embodiment of the present invention has been incorporated.

Referring now to the drawings and in particular to FIG. 1, there is illustrated a cross-sectional diagram of an electronic device in which a preferred embodiment of the present invention is incorporated. As shown, an electronic device 10 includes a chip 11 mounted on top of a substrate 12 that is connected to multiple pins 14. Chip 11 is preferably made of silicon having multiple electronic components, and substrate 12 is preferably made of ceramic, as they are commonly known in the art.

The operating temperature of electronic device 10 can be quite high, but electronic device 10 cannot be cooled by air when it is being used in an outer space environment. Thus, a new type of packaging is needed for electronic device 10 in order to allow chip 11 to be cooled via conduction cooling.

Figure 2:
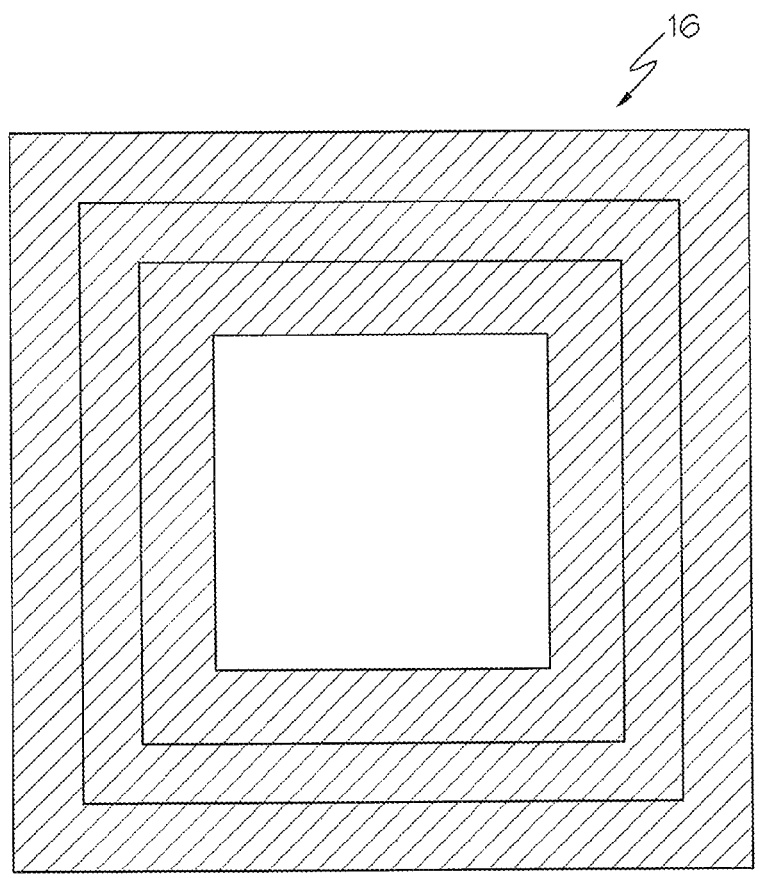
FIG. 2 is a top view of a window frame for the electronic device from FIG. 1.

In accordance with a preferred embodiment of the invention, the new type of packaging includes an anchor ring 14 and a kovar ring 15 located on top of substrate 12. Anchor ring 14 and kovar ring 15, which can be round, square or rectangular, are configured to secure a window frame 16. Window frame 16 can be made of metallized kovar having a cutout located in the center of window frame 16, as shown in FIG. 2. Although the cutout in FIG. 2 is shown to be in a square shape, it is understood by those skilled in the art that the cutout can be rectangular or circular. Window frame 16 includes a U-shape bend to allow itself to be rested on anchor ring 14. Window frame 16 is soldered to chip 11 with backside metallization using a tin-antimony solder. Window frame 16 is also sealed to kovar ring 15 that formed a hermetic cavity with a seam-weld.

Figure 3:
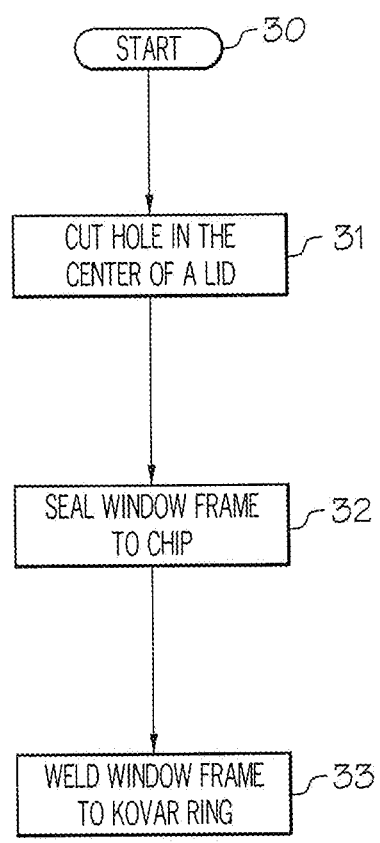
FIG. 3 is a process flow diagram of a method for making a new packaging to allow for cooling the electronic device from FIG. 1, in accordance with a preferred embodiment of the present invention.

Referring now to FIG. 3, there is illustrated a process flow diagram of a method for making the above-mentioned new packaging for cooling electronic device 10, in accordance with a preferred embodiment of the present invention. Starting at block 30, window frame 16 can be made by cutting a hole in the center of a lid suitable for electronic device packaging, as shown in block 31. If substrate 12 is thicker than window frame 16, substrate 12 may be milled to an appropriate thickness to accommodate the height of window frame 16. Alternatively, a lid having a U-shaped bend designed to an appropriate thickness can be chosen.

Window frame 16 is then sealed to chip 11, as depicted in block 32, using a two-step soldering process. First, a tin/antimony (95%/5%) solder-preform is soldered to window frame 16 at 300° C. peak for four minutes on a nitrogen belt-furnace. Next, window frame 16 having the solder-preform is then joined to chip 11 at 280° C. for a 3-min dwell in a nitrogen belt-furnace. No flux is needed for this two-step soldering process; however, the back side metallization of chrome/copper/gold stack has to be previously deposited on the back side of chip 11 at the wafer level.

Tin/antimony is selected as solder-preform for the seal for the present RR embodiment because of its position in the temperature hierarchy of electronic device 10. The underfill material degrades at about 300° C., so any solder used must be reflowed below 300° C. Tin/antimony reflows at 240° C. and is conventionally reflowed between 270° C. and 280° C. Other types of solder, such as SAC alloys, lead/tin alloys, etc., may also be used as solder-preform for the seal as long as their reflow temperature is below 300° C.

After window frame 16 has been sealed to chip 11, the outer perimeter of is window frame 16 is then seam-welded to kovar ring 15, as shown in block 33. As this point, electronic device 10 should be able to pass a hermeticity test even after going through fifty temperature cycles to Condition C of MIL-STD 883 TM 1010 (−65° C. to 155° C.). Hermeticity is provided by window frame 16 that is solder sealed to chip 10 and is also welded to kovar ring 15. Since the center of window frame 16 is open, the backside of chip 10 is now exposed to allow for a direct cooling path for the next-level assembly.

An alternative embodiment of the direct access cooling concept is to integrate a heat-spreader into a hermetic lid. An integrated heat spreader is more preferable from a thermal perspective because drivers are typically placed on the periphery of a chip for routability reasons.

Figure 4:
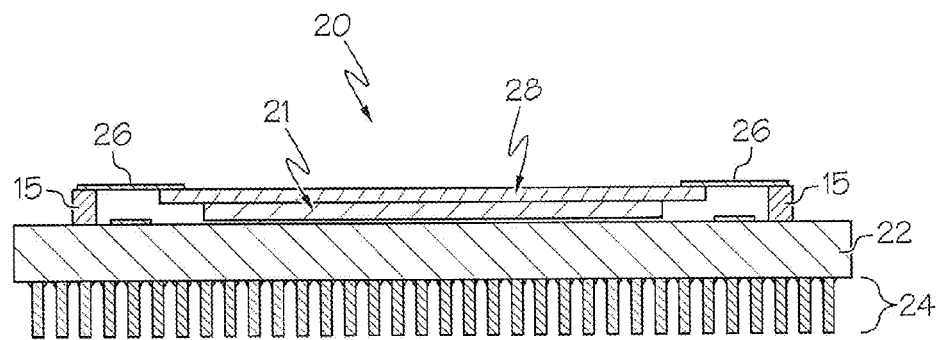
FIG. 4 is a cross-sectional diagram of an electronic device in which an alternative embodiment of the present invention has been incorporated.

With reference now to FIG. 4, there is illustrated a cross-sectional diagram of a chip in which an alternative embodiment of the present invention is incorporated. As shown, an electronic device 20 includes a chip 21 mounted on top of a substrate 22 that is connected to multiple pins 24. Chip 21 is preferably made of silicon having multiple electronic components, and substrate 22 is preferably made of ceramic, as they are commonly known in the art.

Electronic device 20 also includes a heat spreader 28 located on top of chip 21. Heat spreader 28 is bonded to the back side of chip 21. Preferably, two different types of materials can be used for heat spreader 28:
  i. aluminum nitride; and
  ii. silicon carbide Both heat-spreader materials are metallized with a stack of TaN/Au seed/Cu/Ni/Au.

Heat spreader 28 is bonded to a window frame 26 using a gold/tin solder. The window-frame/heat-spreader assembly is bonded to the backside of chip 21. Window frame 26 can be made of metallized kovar having a cutout located in the center of window frame 26 similar to window frame 16 shown in FIG. 2. Unlike window frame 16 having a U-shape bend, window frame 26 can be planar. The center cutout for window frame 26 can be in any shape including square, rectangular or circular. Chip 21 has been backside metallized with a chrome/copper/gold stack. Preferably, silver glass is used as a bonding material. The silver glass has enough compliance such that it will not crack. Window frame 26 is also sealed to kovar ring 25 that formed a hermetic cavity with a seam-weld.

Figure 5:
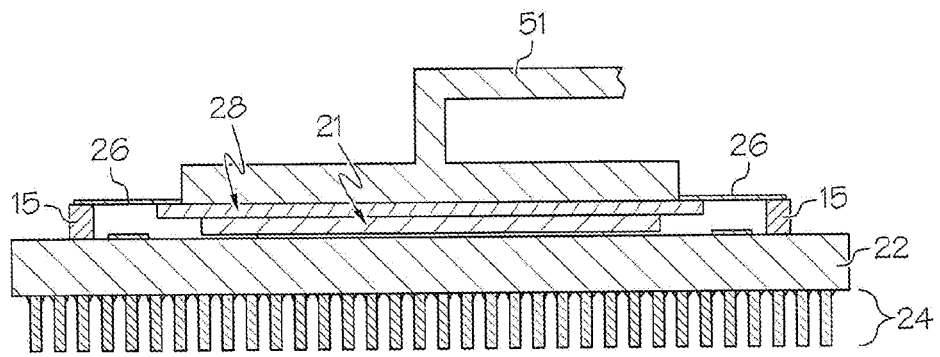
FIG. 5 is a diagram of a heat pipe for pulling heat from the backside of the chip from FIG. 4.

Referring now to FIG. 5, there is depicted a diagram of a heat pipe for pulling heat from the backside of chip 21. As shown, a heat pipe 51 is in direct contact with heat spreader 28. Similarly, heat pipe 51 can be used to cool chip 11 in the configuration shown in FIG. 2.

As has been described, the present invention provides a method and apparatus for cooling electronic devices to be used in the vacuum of space.

While the invention has been particularly shown and described with reference to a preferred embodiment, it will be understood by those skilled in the art that various changes in form and detail may be made therein without departing from the spirit and scope of the invention.

What is claimed is:

1. A method for cooling an electronic device, said method comprising:
  providing a window frame as packaging for an electronic device having a substrate and a chip, wherein said window frame includes a center opening to allow a beat pipe to be in direct contact with a backside of said chip through said center opening;
  sealing said window frame to said backside of said chip;
  welding said window frame to an alloy ring located on said substrate to provide a hermetic seal between said window frame and said substrate; and
  attaching a heat pipe to said backside of said chip.

2. The method of claim 1, wherein said backside of said chip is metallized with a chrome/copper/gold stack.

3. The method of claim 1, wherein said sealing further includes sealing said window-frame to said backside of said chip with a tin/antimony solder-preform.

4. The method of claim 1, wherein said window frame is made of alloy.

5. A method for cooling an electronic device, said method comprising;
  placing a heat spreader on a backside of a chip of an electronic device having a substrate;
  bonding a window frame to said heat spreader, wherein said window frame includes a center opening to allow a heat pipe to be in direct contact with said heat spreader located on said backside of said chip through said center opening;
  welding said window frame to an alloy ring located on said substrate to provide a hermetic seal between said window frame and said substrate; and
  attaching a heat pipe to said heat spreader located on said backside of said chip.

6. The method of claim 5, wherein said backside of said chip is metallized with a chrome/copper/gold stack.

7. The method of claim 6, wherein silver glass is used as a bonding material for said chrome/copper/gold stack on said backside of said chip.

8. The method of claim 5, wherein said bonding further includes bonding said window frame to said heat spreader via a gold-tin solder.

9. The method of claim 5, wherein said window frame is made of alloy.

10. The method of claim 5, wherein said heat spreader is made of aluminum nitride.

11. The method of claim 5, wherein said heat spreader is made of silicon carbide.

12. An electronic device comprising:
  a substrate;
  a chip located on top of said substrate;
  a heat spreader located on a backside of said chip;
  an alloy ring located on top of said substrate; and
  a window frame as packaging for said chip, wherein said window frame includes a center opening to allow a heat pipe to be in direct contact with said heat spreader located on said backside of said chip through said center opening, wherein said window frame is hermetically sealed to said heat spreader, wherein said window frame is welded to said alloy ring to provide a hermetic seal between said window frame and said substrate.

13. The electronic device of claim 12, wherein said backside of said chip is metallized with a chrome/copper/gold stack.

14. The electronic device of claim 12, wherein said heat spreader is made of aluminum nitride.

15. The electronic device of claim 12, wherein said heat spreader is made of silicon carbide.

16. The electronic device of claim 12, wherein said window frame is made of alloy.

* * * * *